United States Patent [19]

Wilson

[11] Patent Number: 4,722,134

[45] Date of Patent: Feb. 2, 1988

[54] PROCESS OF PRODUCING SUPERCONDUCTING BAR MAGNETS

[75] Inventor: Michael A. Wilson, Franklin, W. Va.

[73] Assignee: Maranatha Research, Ltd., Franklin, W. Va.

[21] Appl. No.: 823,757

[22] Filed: Jan. 29, 1986

[51] Int. Cl.⁴ ............................................. H01L 39/24
[52] U.S. Cl. ........................................ 29/599; 335/216
[58] Field of Search ........................... 29/599; 335/216

[56] References Cited

U.S. PATENT DOCUMENTS 3,486,146 12/1969 Williams .......................... 29/599 X
4,190,817 2/1980 Rabinowitz ...................... 29/599 X Primary Examiner—P. W. Echols
Assistant Examiner—Carl J. Arbes
Attorney, Agent, or Firm—A. W. Breiner

[57] ABSTRACT

A bar magnet is provided comprising a billet of superconducting material in a superconducting condition and having an established magnetic field. The bar magnet is formed by exposing the billet of superconducting material to a magnetic field of the desired extent and shape while the superconducting material is above its critical temperature. While being exposed to the magnetic field, the billet of superconducting material is lowered to its critical temperature so as to stabilize the intensity and pattern of the field. The magnetic field is them removed from the billet of material and the billet maintained at or below the critical temperature.

6 Claims, 9 Drawing Figures

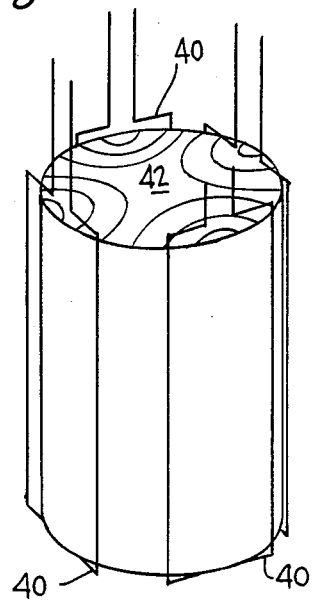
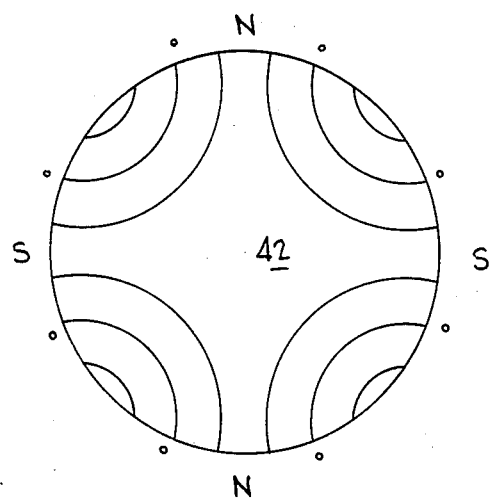
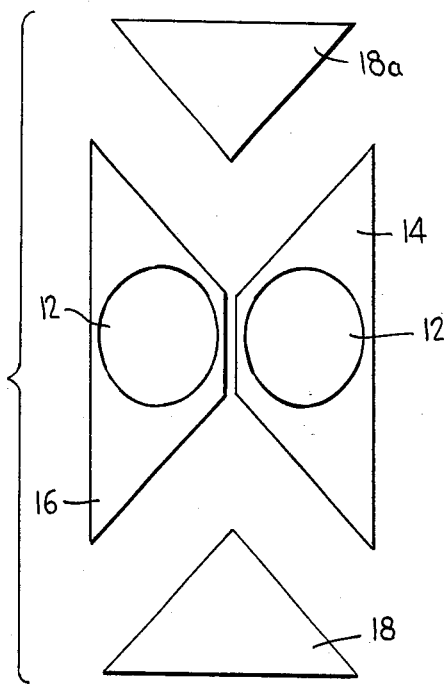
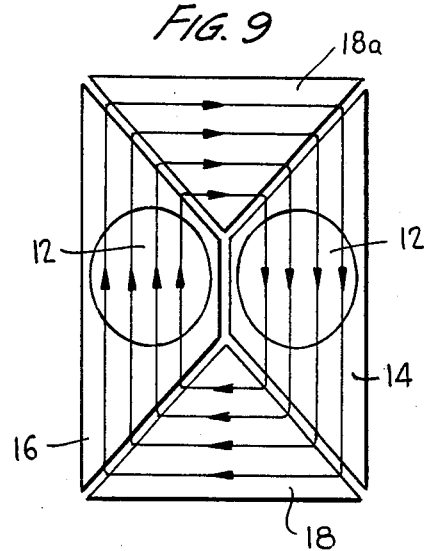

PROCESS OF PRODUCING SUPERCONDUCTING BAR MAGNETS

FIELD OF INVENTION

This invention relates to magnets. More particularly, this invention relates to magnets, such as a bar magnet, comprising a superconducting material maintained under superconducting conditions.

BACKGROUND AND PRIOR ART

Magnets and the concept of magnetism have been known since ancient times. Faraday, in the 1830's, demonstrated the relationship between an electric charge and magnetism. When an electric charge moves, it is said to constitute an electric current. When an electric current flows, it generates a magnetic field in the space around it just as if the current system had been replaced by a magnet system with a particular shape. It takes a force, called an electromotive force (EMF), analogous to the pressure needed to cause water to flow in a pipe to make a charge move and, thus, produce an electric current. Faraday established that when an object capable of conducting electric current was moved through a magnetic field an EMF was set up in the conductor capable of producing electric current. He also demonstrated that when the magnetic field which "threaded" a conducting object was changed, an EMF was also produced. Accordingly, electricity produces magnetism and magnetism produces electricity. Faraday also recognized the concept that magnetism exists only in a closed loop. It can be shown that the driving force, called the magnetomotive force (MMF), in a magnetic circuit of an electromagnet, analogous to EMF in an electric circuit, is proportional both to the number of turns which form the coil and the current in that coil. A recognition of the relationship between magnetism and electricity has permitted the formation of electromagnets of varying strength and capacity by winding coils onto a core material.

The advent of new technologies utilizing magnets has increased the need for magnets having greater field uniformity and stability. For example, Nuclear Magnetic Resonance, normally referred to as NMR, a technique discovered in 1945 for measuring the magnetic properties of individual atomic nuclei has become widely used in chemical analysis to determine structures of molecules. Although NMR technology was originally used primarily as a tool to the chemist for determining the structure of new compounds, particularly in the pharmaceutical industry and in university research laboratories, the technique is now being applied to a much broader spectrum, including to the study of biological problems and in medical research such as in the detection of cancer in tissue. In an NMR system it is essential to have magnets which have a magnetic field of high uniformity and known and well-defined pattern. By having a magnetic field of high uniformity and known and well-defined pattern, it is possible to pick up signals from the atomic nuclei being acted upon, and then have that signal analyzed and recorded.

Electron Magnetic Resonance (EMR) has also provided a need for improved magnets. The term Magnetic Resonance (MR) embraces both NMR and EMR.

In the prior art fabrication of the magnets for MR application, precision wound coils are produced under the guidance of very slow computer controlled coil winders. After fabrication, the coils are carefully tweaked and adjusted to maximize uniformity. In operation they are accompanied by a relay rack full of electronics requiring constant attention to maintain field uniformity. Furthermore, the only fields allowing theoretical description are free space fields, and as a result the current designs all use fields that extend far beyond the magnet system. The fields external to the system are disturbed by magnetic objects. Movement of such objects contributes to the frequent need for readjustment.

Accordingly, there is a need for magnets having a magnetic field of high uniformity and stability for use in MR and the like systems which are relatively inexpensive and which can be more rapidly fabricated.

OBJECTS AND GENERAL DESCRIPTION OF INVENTION

It is a primary object of the present invention to provide a superconducting magnetic system which is relatively inexpensive.

It is another object of the present invention to provide a superconducting bar magnet which has good field uniformity and stability, and wherein the magnetic field is substantially coextensive with the magnet.

It is another object of the present invention to provide a method for producing a bar magnet having a magnetic field of high uniformity and good stability.

These and other objects of the present invention will be apparent from the following general description and from the presently preferred embodiment as illustrated in the drawing.

The objects of the present invention are accomplished by establishing a magnetic field of predetermined extent and shape; providing a superconducting material of desired shape; positioning the superconducting material in the established magnetic field while at a temperature above the critical temperature of the superconducting material so as to apply the predetermined magnetic field on the superconducting material; cooling the superconducting material while in the magnetic field to a temperature below the critical temperature of the superconducting material; removing the superconducting material from the magnetic field while in the supercooled condition, and maintaining the material at or below the critical temperature to provide a bar magnet comprising the superconducting material in a superconducting condition and having an established magnetic field.

A bar magnet as used herein defines any magnet not relying on coils to create a magnetic field. The establishing of, and the established magnetic field includes no magnetic field, as will be described more fully hereinafter. Flux, as used herein, means the flow or density of magnetic lines.

The objects of the present invention are possible as a result of the phenomenon of superconductivity and the recognition that if the temperature of a superconducting material is lowered to its critical temperature the material loses its ability to change the internal magnetic field, i.e., becomes magnetostatic. Stated in another way, a magnetic field present in a superconductive material when it achieves the superconducting state will remain fixed in the superconducting material as long as the material is retained in the superconducting state.

The phenomenon of superconductivity occurs at very low temperatures, within about 25 degrees of the absolute zero. It is characterized by the complete loss of electrical resistance in the material at a certain critical temperature known as the transition temperature, $T_c$. Above this temperature, superconductors behave in a similar way to other metals and are said to be in the normal state; and below it, they are in the superconducting state. Once the temperature has been reduced below $T_c$, electrical currents can be passed through the material without the generation of heat because the resistance is zero. This means that superconducting materials can transmit large amounts of energy without the losses which would occur in conventional conductors such as copper. The critical temperature of a superconducting material is decreased in the presence of a strong magnetic field.

The bar magnets of the present invention can be made up of any of the superconducting materials, including elements and alloys which have superconducting properties. A large, but not an exhaustive listing of superconducting materials is set forth in "Superconductivity," *CRC Handbook of Chemistry and Physics*, College Edition, 49th Edition 1968–1969, The Chemical Rubber Co., Cleveland, Ohio, at pages E-81 through E-96. The aforesaid disclosure is incorporated herein by reference. Representative and useful superconducting materials are aluminum, tin, titanium, cadmium and ruthenium; as well as alloys of aluminum and tin, and aluminum and zinc. The known superconducting materials have transition temperatures up to 23° K. (−250° C.). The superconducting materials having high critical temperatures and critical fields are preferred in that if the critical temperatures and critical fields are too low, they are driven normal by relatively small currents. The aforesaid characteristics are known in the art and form no part of the present invention.

THE DRAWING AND PRESENTLY PREFERRED EMBODIMENT

A presently preferred embodiment will be described in reference to the drawing wherein -

FIG. 6 is a perspective view of a cylindrical billet of superconducting material exposed to a plurality of magnetic fields;

FIG. 7 is an end view of the billet of FIG. 6 after the magnetic fields have been applied and the material lowered to its supercritical temperature;

FIG. 8 is the end view of a plurality of superconducting bars configured for utilization in magnetic field piping; and FIG. 9 is the plurality of magnetic bars of FIG. 8 positioned so as to provide a superconducting magnet with essentially no external field, except for end effects, and having two sample chambers.

Figure 1:
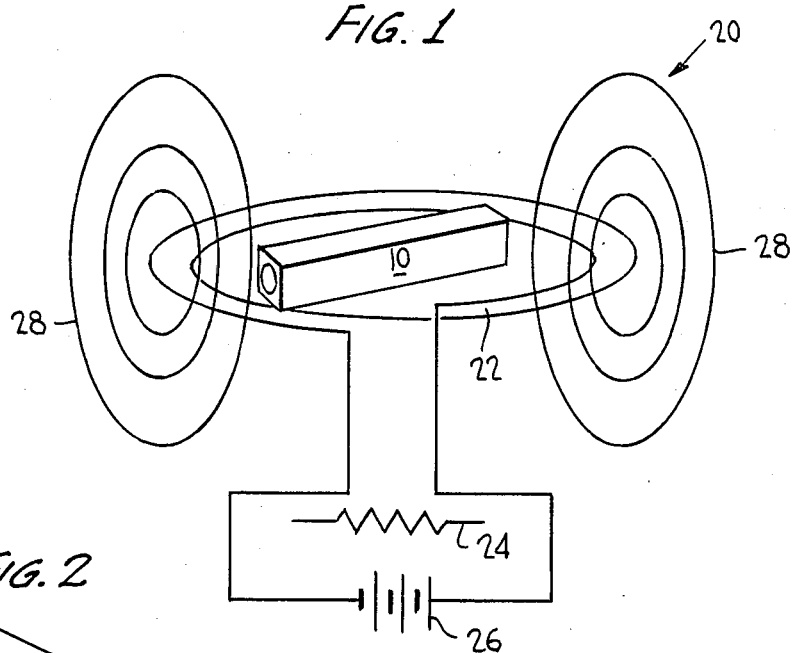
FIG. 1 is a diagrammatic view of a billet of superconducting material in a predetermined magnetic field.

As shown in FIG. 1, a billet 10 of superconducting material which is an alloy of aluminum (Al), niobium (Nb), and tin (Sn) having a longitudinally extending hole 12 is positioned in the center of a magnetic field 20 created by a generating copper coil 22. The intensity of the field is controlled by the heat applied through heating element 24 and current source 26. The shape of the field is diagrammatically illustrated at 28.

Figure 2:
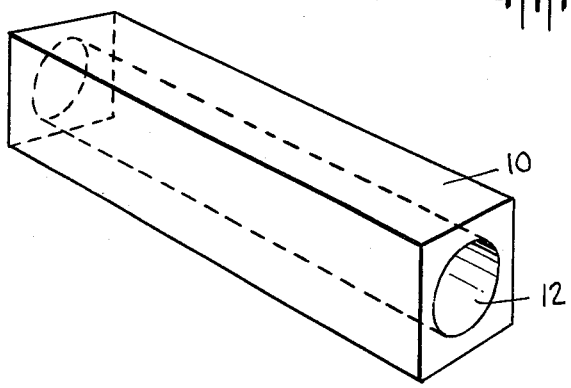
FIG. 2 is a perspective view of a billet of superconducting material having a hole longitudinally directed through the material.

As shown in FIG. 2, the superconducting billet 10 has a hole 12 extending longitudinally through the material. It is recognized that in an enclosed volume the magnetic field within the volume is determined by the intensity and direction of the field at the surface of the volume. In the case of a partially enclosed volume, the same condition is true except for the effect of the opening, i.e., such as end effects, as will be considered hereinafter. In an NMR system, the sample to be analyzed can be positioned in the hole as is conventionally done.

Figure 3:
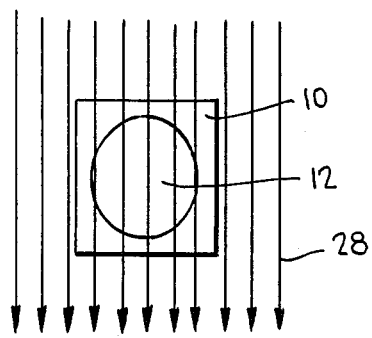
FIG. 3 is a diagrammatic view of the end of the billet of material of FIG. 2 positioned in a magnetic field.
Figure 4:
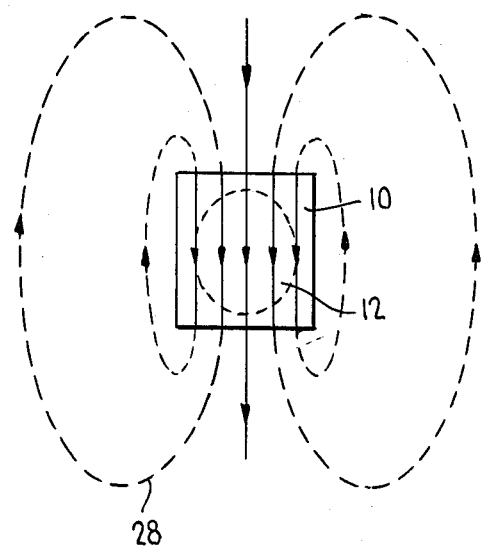
FIG. 4 is a diagrammatic end view of the superconducting bar magnet diagrammatically illustrating the magnetic field.
Figure 5:
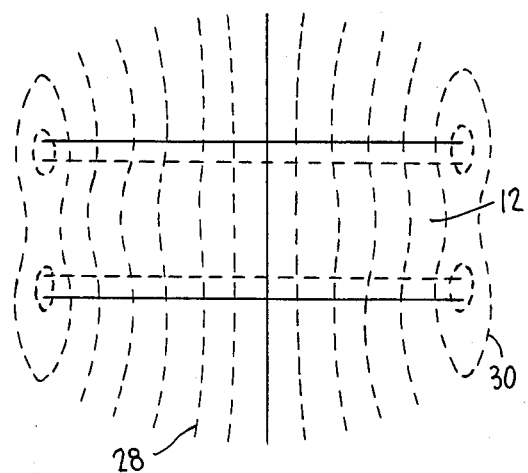
FIG. 5 is a diagrammatic side view of the billet of material of FIG. 2 diagrammatically illustrating the end effects of the billet.

In accordance with the present invention, a magnetic field 28 of the desired extent and shape is formed utilizing conventional means such as the generating copper coil 22 as shown in FIG. 1. The established field can also be no magnetic field. After the magnetic field of the desired extent and shape is established, the billet 10 is placed in the field as shown in FIGS. 1 and 3 above the critical temperature of the superconducting material in order to impart to the magnetic material a corresponding magnetic field. The shape of the field is defined by the coil, or coils, prior to cooling of the billet. Thereafter, while the billet is in the magnetic field the temperature is lowered below the critical temperature of the superconducting material. This stabilizes the intensity and pattern of the magnetic field. After the billet is cooled to superconducting temperature within the magnetic field, the magnetic field is removed and the billet retained at superconducting conditions. As long as the billet is maintained at the critical temperature—i.e., in a superconducting condition, the magnetic field will be uniformly maintained in its stabilized condition. The magnet can be maintained in superconducting conditions in a known manner, such as with liquid helium. As shown in FIG. 4, the only lack of uniformity within the field 28 is a result of the end effect as diagrammatically shown in FIG. 5 at 30. The end effect can be minimized by having hole 12 of a diameter no more than about one-tenth of the length of the billet. At times it may be desirable to use a plurality of bar magnets having complementary shapes in order to obtain a magnet having the desired magnetic field shape. Thus, where it is not possible to obtain the desired magnetic field shape using conventional techniques, it can be desirable to form a plurality of magnets in complementary shapes and piece the complementary shapes together to provide a bar magnet having the desired magnetic field shape.

The magnetic field can be maintained substantially within a magnet in accordance with the present invention by utilizing a piping technique. As shown in FIG. 8, billets 14 and 16 which complement each other are formed, each having a longitudinally extending hole 12 as shown in FIG. 8. Additionally, end pieces 18 and 18a are formed. After the materials are subjected to a magnetic field as above described, the elements are placed together as shown in FIG. 9. As is apparent, one bar of superconducting alloy can be used for each direction the field is to be carried—in the instance shown, four directions. When the materials are placed as shown in FIG. 9, the external field is almost completely eliminated. This will provide a magnet which can be retained in a relatively small area. Since there is no free magnetic field, the magnet will not be influenced by external objects which may come near the magnet. Field piping can also be accomplished with hollow tubes of a superconducting material.

As set forth hereinbefore, according to the present invention it is possible to make the "bar magnet" in the absence of a magnetic field. When the superconducting material is lowered below its critical temperature, it will have no magnetic field at all. Effectively, the bar magnet will serve as a magnetic insulator similar to an insulator for electrical current. The insulator can be used to block magnetic effects as well as have various other applications where it is desired to completely eliminate a magnetic field.

The concept and the bar magnets of the present invention have applications other than as a magnet for an MR system. They can be used in virtually any application of conventional magnets and where it is possible to maintain the magnets at or below the critical temperature. For example by providing a plurality of magnetic fields 40 as around a cylindrical element as shown in FIG. 8, a cylindrical magnet 42 can be formed as shown in FIG. 7. This magnet having a plurality of magnetic fields can be used as an electric motor and the like.

As will be apparent to one skilled in the art, various modifications can be made within the scope of the aforesaid description. Such modifications such as size, shape, and intensity of field being within the ability of one skilled in the art form a part of the present invention and are embraced by the appended claims.

It is claimed:

1. A method of forming a magnet having an established magnetic field comprising;
    (1) establishing a magnetic field of the desired extent and shape;
    (2) providing a superconducting material of desired shape;
    (3) positioning the material of (2) in field (1) while at a temperature above the critical temperature of the superconducting material so as to apply a magnetic field on the superconducting material;
    (4) cooling the superconducting material while in magnetic field (1) to below the critical temperature of the superconducting material;
    (5) removing the superconducting material from the magnetic field while in the supercooled condition; and
    (6) maintaining the material at or below the critical temperature.

2. The method of claim 1 wherein the magnet is a bar magnet.

3. The method of claim 1 wherein said magnet is a coil magnet.

4. The method of claim 1 wherein the intensity of said magnetic field is zero.

5. The method of claim 1 wherein said superconducting material is an alloy.

6. The method of claim 1 wherein said superconducting material is maintained at or below the critical temperature with liquid helium.

* * * * *